(12) United States Patent
Ohshima et al.

(10) Patent No.: US 9,208,994 B2
(45) Date of Patent: Dec. 8, 2015

(54) ELECTRON BEAM APPARATUS FOR VISUALIZING A DISPLACEMENT OF AN ELECTRIC FIELD

(75) Inventors: Takashi Ohshima, Saitama (JP); Michio Hatano, Tokyo (JP); Hideo Morishita, Hachioji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/817,086

(22) PCT Filed: Jul. 7, 2011

(86) PCT No.: PCT/JP2011/065547
§ 371 (c)(1),
(2), (4) Date: Feb. 14, 2013

(87) PCT Pub. No.: WO2012/023354
PCT Pub. Date: Feb. 23, 2012

(65) Prior Publication Data
US 2013/0146766 A1    Jun. 13, 2013

(30) Foreign Application Priority Data
Aug. 18, 2010 (JP) ................................. 2010-182755

(51) Int. Cl.
*G01N 23/00* (2006.01)
*H01J 37/26* (2006.01)
*H01J 37/28* (2006.01)

(52) U.S. Cl.
CPC ............. *H01J 37/261* (2013.01); *H01J 37/265* (2013.01); *H01J 37/28* (2013.01);
(Continued)

(58) Field of Classification Search
CPC ......... H01J 37/00; H01J 37/02; H01J 37/026; H01J 37/20; H01J 37/1478; H01J 37/26; H01J 37/285
USPC ........................................... 250/306, 307, 311
See application file for complete search history.

(56) References Cited

U.S. PATENT DOCUMENTS 5,900,629 A    5/1999    Todokoro et al.
6,730,907 B1   5/2004    Feuerbaum et al.
(Continued)

FOREIGN PATENT DOCUMENTS

JP    9-171791 A    6/1997
JP    11-86770 A    3/1999
(Continued)

OTHER PUBLICATIONS

International Search Report including English translation dated Aug. 9, 2011 (Four (4) pages).

*Primary Examiner* — Michael Logie
*Assistant Examiner* — Jason McCormack
(74) *Attorney, Agent, or Firm* — Crowell & Moring LLP

(57) ABSTRACT

The present invention provides an electron beam apparatus comprising a means for visualizing an axial displacement of a retarding electric field, and a means for adjusting axial displacement. The axial displacement visualizing means includes a reflective plate (6), and an optical system (2, 3) for converging a secondary electron beam (9) on the reflective plate (6), and the axial displacement adjusting means includes an incline rotation mechanism (8) for a sample stage (5). With this configuration, in electron beam apparatuses such as SEM and the like, such problems as visual field displacement caused by displacement of the axial symmetry of the electric field between an objective lens (3) and a sample (4) and inability to measure secondary electrons and reflected electrons that provide desired information can be eliminated.

17 Claims, 15 Drawing Sheets

(52) U.S. Cl.
CPC ..... *H01J 2237/153* (2013.01); *H01J 2237/202* (2013.01); *H01J 2237/20207* (2013.01); *H01J 2237/20221* (2013.01)

(56) References Cited

U.S. PATENT DOCUMENTS

| | | | |
|---|---|---|---|
| 2006/0169901 A1* | 8/2006 | Nguyen-Huu et al. | 250/311 |
| 2008/0237465 A1 | 10/2008 | Hatano et al. | |
| 2009/0039264 A1* | 2/2009 | Ikegami et al. | 250/311 |
| 2009/0101816 A1* | 4/2009 | Noji et al. | 250/310 |
| 2009/0166557 A1* | 7/2009 | Makino et al. | 250/442.11 |
| 2009/0256076 A1* | 10/2009 | Fukuda et al. | 250/311 |
| 2010/0116977 A1* | 5/2010 | Young et al. | 250/252.1 |
| 2010/0181480 A1* | 7/2010 | Shimakura et al. | 250/310 |
| 2010/0224781 A1* | 9/2010 | Hosokawa | 250/311 |
| 2011/0121176 A1* | 5/2011 | Sijbrandij et al. | 250/307 |
| 2011/0139983 A1 | 6/2011 | Doi | |

FOREIGN PATENT DOCUMENTS

| | | |
|---|---|---|
| JP | 2000-173519 A | 6/2000 |
| JP | 2000-286310 A | 10/2000 |
| JP | 2003-503820 A | 1/2003 |
| JP | 2006-162609 A | 6/2006 |
| JP | 2008-243485 A | 10/2008 |
| JP | 2010-40461 A | 2/2010 |
| JP | 2010-55756 A | 3/2010 |

* cited by examiner

SEM IMAGE

SAMPLE STAGE

FIG. 9G

PARTIALLY ENLARGED VIEW OF SAMPLE

ELECTRON BEAM APPARATUS FOR VISUALIZING A DISPLACEMENT OF AN ELECTRIC FIELD

TECHNICAL FIELD

The present invention relates to an electron beam apparatus such as a low-acceleration type scanning electron microscope that applies electron beams to a sample at a low acceleration.

BACKGROUND ART

The scanning electron microscope (SEM) that allows observation of a microstructure has been employed for observation of samples in various fields. Especially, the low-acceleration type SEM that applies the electron beam to the sample at the acceleration of 5 kV or lower is very useful as it provides such advantages of causing less damage to the sample, having small penetration depth of the electron beam to allow observation of the nano-structure of the surface, and allowing easy observation of the sample that is likely to be charged under the condition with well balance between quantities of the incident electron and the electron emitted from the sample.

Under the aforementioned low-acceleration condition, chromatic aberration of the electron beam on the objective lens is increased to deteriorate the resolution. Accordingly, high-resolution observation requires the technology for suppression of the chromatic aberration. One of technologies is so called a semi-in-lens or a snorkel lens formed by designing the magnetic path of the objective lens so that the peak of the magnetic field on the axis is closer to the sample side than the side of the objective lens. This reduces a focal point distance f that substantially contributes to the chromatic aberration, resulting in the high resolution even at the low acceleration condition.

Another technology is the retarding method that generates an electric field between the sample and the objective lens, which decelerates the electron beam of the probe (for example, Patent Literature 1 and 2). Normally, the negative voltage is applied to the sample. In this case, even if the incident energy to the sample is reduced, the energy passing through the objective lens can be intensified, thus reducing the chromatic aberration of the objective lens. Employment of both the semi-in-lens and the retarding technology realizes the high-resolution observation irrespective of the low incident energy. Upon discrimination of the electron energy generated from the sample under the aforementioned conditions, irregularities on the surface are identified by the secondary electron (SE) having low energy. Meanwhile, the contrast that reflects the atomic number and density of the material is obtained through measurement of the backscattered electron (BSE) having high energy. The aforementioned information may be derived from an SEM image, which allows the analysis in a short time.

In the case where the retarding method is employed, if the incident energy is 1 kV, the difference in generated energy between the SE and BSE becomes 1 kV at most. When the energy of 2 kV is applied for retarding, each orbit of both electrons becomes substantially the same. It is therefore difficult to perform energy discrimination and detection. For this, another lens or ExB field (the state where the electric field orthogonally intersects the magnetic field) for detection is provided at the position closer to the side of the electron source than the objective lens to perform the energy discrimination using the phenomenon that the orbit varies in accordance with the energy difference as disclosed in Patent Literature 1.

When intending to have the observation by changing the incident energy to the sample, the user changes the acceleration voltage of the probe electron beam. In such a case, the variable conditions for the electronic optical system have to be adjusted. Much time and high operation skill are required to change the focal point, astigmatism, visual field, and contrast and brightness of the image. An idea to provide the function for automatically adjusting those conditions may be easily thought. However, it is difficult to establish such automatization in conformance to all conceivable cases. As a result, the function is effective under the limited condition, which also adds cost for the apparatus, resulting in high price.

CITATION LIST

Patent Literature

Patent Literature 1: Japanese Patent Application Laid-Open Publication No. 2008-243485
Patent Literature 2: Japanese Patent Application Laid-Open Publication No. 2000-173519

SUMMARY OF INVENTION

Technical Problem

It has been found that, depending on the sample, the structure disclosed in Patent Literature 1 may fail to discriminate the energy of the electron generated upon retarding under the high-resolution condition for the purpose of coping with the demand expected to be further increased. It is discovered that the generated retarding electric field does not necessarily have axial symmetry in most cases.

If the observed image is moved by applying the retarding electric field, that is, visual field displacement occurs, the position desired to be observed has to be located again after application of the retarding voltage. Means for correcting the displacement is realized by slightly changing the retarding voltage so as to minimize movement of the image through adjustment by the aligner for the electromagnetic field as disclosed in Patent Literature 2.

The condition adjusted by the aforementioned method is established only in case of the specific retarding electric field and the incident energy. Adjustment, thus, is required each time when the condition is changed. There is a concern about difficulty in the energy discrimination performed with the high-resolution for reasons as described below. That is, the energy is different for each of the generated SEs, which is not necessarily preferable condition. As for the BSE, the alignment in the magnetic field does not follow the same orbit as the probe electron in the inverse direction, but follows the orbit further deviating from the axis.

It is an object of the present invention to provide an electron beam apparatus capable of reducing the influence owing to the non-axial symmetry of the retarding electric field, and acquiring information by performing the energy discrimination under the condition of low-acceleration and high-resolution.

Solution to Problem

The electron beam apparatus according to the present invention includes the means for visualizing the axial displacement of the retarding electric field and the means for adjusting the axial displacement by changing the inclination of the sample stage.

Advantageous Effects of Invention

The visual field displacement caused by the retarding electric field and the orbit displacement of the detection electron may be alleviated by providing the means for visualizing the axial displacement of the retarding electric field, and the means for adjusting the axial displacement by changing inclination of the sample stage. This makes it possible to provide the electron beam apparatus capable of acquiring information by performing the energy discrimination under the conditions of low-acceleration and high-resolution.

BRIEF DESCRIPTION OF DRAWINGS

FIGS. 6A and 6B show another example of a detector used for the electron beam apparatus according to the first embodiment, wherein FIG. 6A represents a semiconductor detector, and FIG. 6B represents a scintillator.

FIGS. 9A to 9H are explanatory views of a procedure of visualizing a displacement of the retarding electric field from the axial symmetry in the electron beam apparatus according to the second embodiment, based on which inclination of the sample stage is changed, wherein FIG. 9A is a graphic representation of an SEM image showing an example of the state of the axial displacement, FIG. 9B is a graphic representation of the SEM image showing an example of the state where the image oscillation is adjusted in a predetermined direction, FIG. 9C is a graphic representation of the SEM image showing an example of the state where the axial displacement is adjusted, FIG. 9D is a perspective view showing a movement of the sample stage upon adjustment of the state shown in FIG. 9A to the state shown in FIG. 9B, FIG. 9E is a perspective view showing a movement of the sample stage upon adjustment of the state shown in FIG. 9B to the state shown in FIG. 9C, FIG. 9F is a cross-section of the sample in the state where the axial displacement has occurred, FIG. 9G is a cross-section of the sample in the state where the axial displacement is adjusted, and FIG. 9H represents a flow of the axial displacement adjustment.

FIGS. 10A to 10C are explanatory views of observing cross-section of a semiconductor substrate using an electron beam apparatus according to the second embodiment, wherein FIG. 10A is a conceptual view of an area around the sample stage that includes equipotential lines of the retarding electric field upon observation of the semiconductor substrate (sample), FIG. 10B is a conceptual view of an area around the sample indicating the state before axial adjustment of the retarding electric field, and FIG. 10C is a conceptual view of an area around the sample indicating the state after the axial adjustment.

DESCRIPTION OF EMBODIMENTS

First Embodiment

Figure 1A:
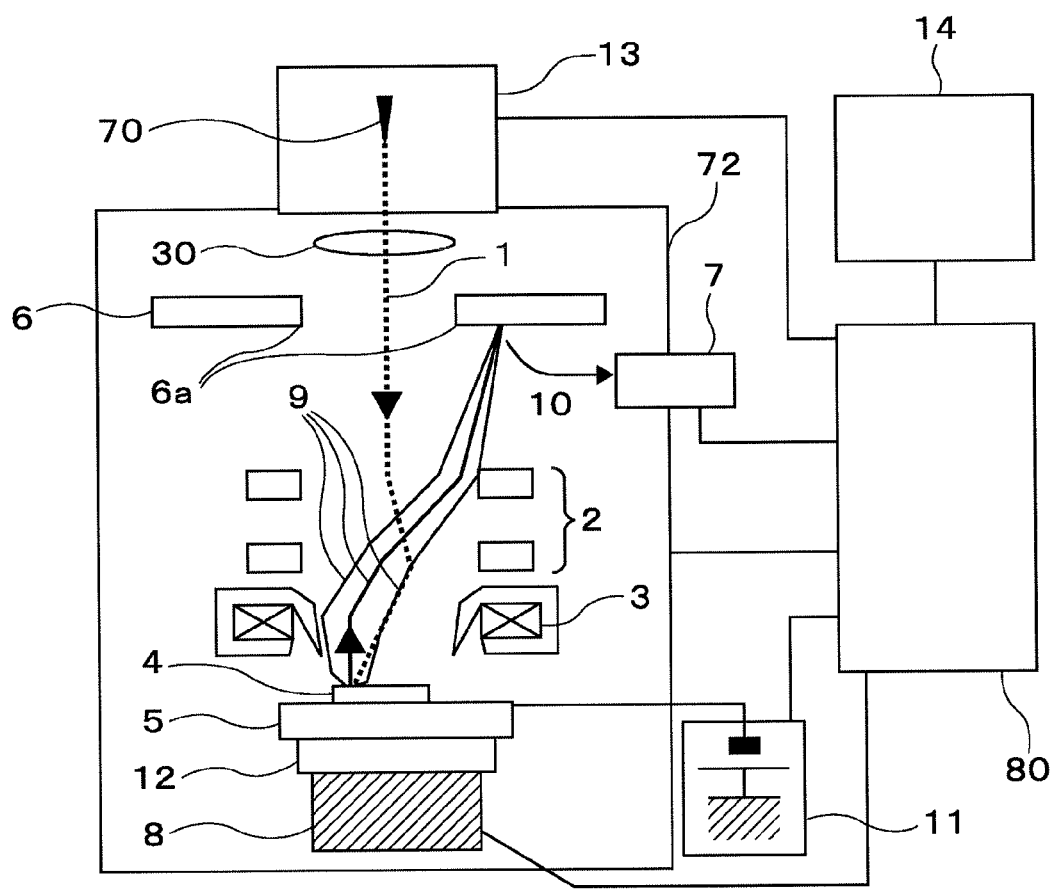
FIG. 1A is a conceptual view of an electron beam apparatus (scanning electron microscope system) according to a first embodiment.

A first embodiment of the present invention will be described referring to FIGS. 1A to 7. FIG. 1A is a conceptual view of a scanning electron microscope (SEM) system as one type of the electron beam apparatus according to the first embodiment. This includes an electron gun 13, an electron lens such as a condenser lens 30 and an objective lens 3, a deflector 2, a detector 7 of the secondary electron and the backscattered electron, a sample stage mechanism (5, 8, 12) that determines an observation region by placing and moving a sample 4, a vacuum vessel (housing) 72, a display device 14 of an SEM image, a controller 80 that controls the SEM as a whole, an evacuation facility (not shown), a vibration isolating mechanism (not shown) and the like.

The electron gun 13 serves as any one of various types of electron sources 70, for example, a CFE (Cold Field Emission), an SE (Schottky Emission), and a thermoelectron (Thermionic Emission). An electron beam 1 to be formed as the probe is deflected by the deflector 2 to transmit the center of the objective lens 3 so as to be converged on and applied to the sample 4 mounted on the sample stage 5.

The objective lens 3 of semi-in-lens type has a principal plane of a magnetic field lens, which is closer to the side of the sample 4 than the side of the objective lens 3 for reducing the aberration. The negative voltage is applied to the sample stage 5 from a Vr power source (retarding power source) 11. In this case, an acceleration voltage V0 of the probe electron beam is preliminarily set to a high value in order to reduce the chromatic aberration of the objective lens 3 at the low acceleration (from equal to or lower than 6 kV to approximately 10 V) so as to decelerate just before the sample at the voltage of Vr. Accordingly, the electric field is formed between the sample and the back surface of the objective lens (0 V). The initial velocity of the secondary electron 9 generated by the sample is low (with the peak at approximately 2 to 3 V), and the thus formed electric field accelerates the secondary electron so as to proceed in the objective lens 3 in the inverse direction of the probe electron beam 1. Although the description is made with respect to the secondary electron, the backscattered electron may be used.

The magnetic field of the objective lens 3 influences up to the sample surface. Then substantially all the generated SEs pass through the objective lens, and are deflected within the magnetic field by the deflector 2 so as to be directed upward to the reflective plate 6. The secondary electron is generated from the reflective plate 6, which will be referred to as a detection electron 10. It is retracted to the detector 7 by the electric field, and converted into an electric signal.

In most cases, an E-T type detector is used as the detector 7, which is formed of a fluorescence substance, a light guide, and a photo multiplier. That is, the detection electron 10 is applied to the fluorescence substance to which a bias voltage of approximately +10 kV is applied so that the photo multiplier converts the generated light into the electric signal, which is appropriately amplified and sent to the controller for the SEM. Then the SEM image of the sample is obtained. The condition of the objective lens 3 is set so that the secondary electron 9 forms the focal point on the reflective plate 6. As the low magnification observation is conducted under the condition, that is, as deflection of the orbit is made larger by the deflector 2, the secondary electron 9 that will be converged in the center hole of the reflective plate 6 is not detected, and accordingly, the image is darkened. If the secondary electron 9 is impinged on the outer side of the hole, it is detected. The bright SEM image is then obtained. The inner side of the hole is observed as the dark round hole. An edge 6a (inner edge) of the hole of the reflective plate 6 may be observed as the bright bordering ring owing to a large number of the detection electrons generated only at this area by the edge effect.

If the position of the thus obtained ring is out of the center in the image (in other words, the retarding electric field has non-axial symmetry), rotation and inclination of the sample stage 5 are adjusted as shown in FIG. 10 so that the ring structure is brought into the center. The rotation and inclination represent an angular rotation Ø of the sample stage 5 with respect to the center O of the observed region and the perpendicular line A-O as the center axis, and an inclination of the stage at an angle θ from the in-plane line Q-O as the axis. If the center position of the rotation and inclination cannot be located at the observation center owing to the function of the sample stage 5, it is necessary to move the respective x-axis, y-axis and z-axis, that is, up and down, and sideways so as not to move the observation region. For the purpose of providing the aforementioned function, the sample stage 5 to which the retarding voltage Vr is applied is formed of the conducting material such as aluminum, and an insulating holder 12 is provided so that the stage is not electrically in contact with the inclination rotating mechanism 8.

Figure 2:
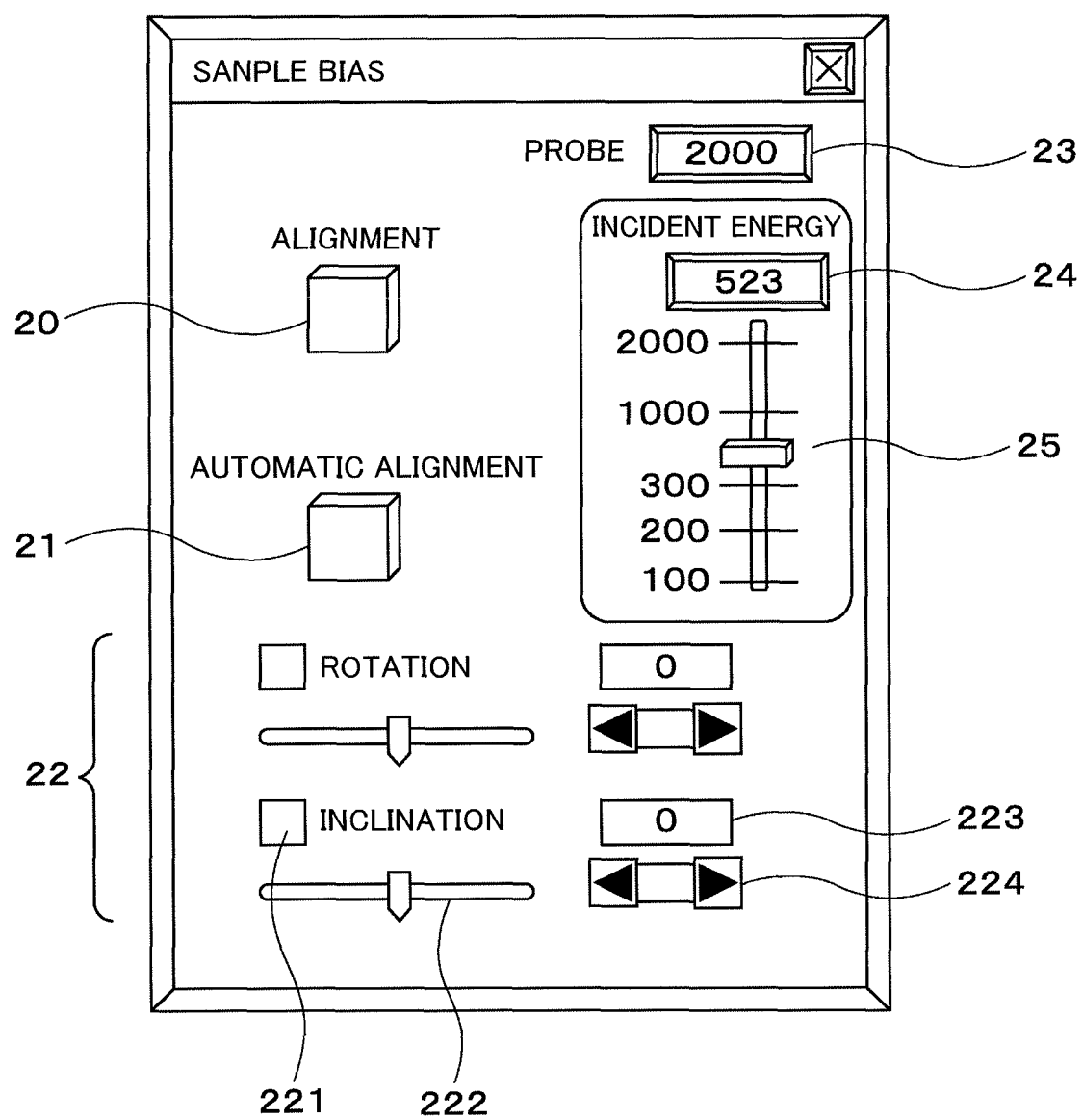
FIG. 2 shows an example of an operation panel for the means for visualizing axial displacement of the retarding electric field, and the means for adjusting the axial displacement in the electron beam apparatus according to the first embodiment.

The operation panel as shown in FIG. 2 is provided on the SEM operation screen for using the aforementioned function. The function is used for axial adjustment so that the retarding voltage is applied to allow observation of low-acceleration and high-resolution. Use of the operation panel allows the user to perform the axial adjustment easily while checking at the visualized image of the axial displacement of the retarding electric field.

The operation panel is displayed on the display device 14, which has been preliminarily called from a basic operation screen via the command or button. Then the retarding voltage Vr is set. It may be preliminarily applied, or acceleration may be set on the panel. An acceleration setting slider 25 and an acceleration display window 24 display the incident energy to the current sample as the acceleration. Dragging of the acceleration setting slider 25, and inputting the figure into the acceleration display window 24 are performed to determine the voltage Vi of the probe electron beam 1 applied to the sample. Then the retarding voltage Vr is applied so as to establish the relationship of Vr=V0−Vi. The probe acceleration voltage V0 is displayed on a probe voltage display window 23. In this case, the operation panel is displayed on the display device 14. However, the operation panel may be provided for dedicated use.

When clicking an alignment start button 20, the electronic optical system sets the exciting current of the objective lens 3, and the condition of the condenser lens located at an upper portion, which is not shown in the drawing so that the secondary electrons 9 form the focal point on the reflective plate 6 as shown in FIG. 1A. The respective lens conditions with respect to the distance between the objective lens 3 and the sample 4, the acceleration voltage V0 of the probe electron beam 1, and the incident voltage Vi of the probe electron beam to the sample are preliminarily provided as data. As a result, the image as shown in FIG. 1B is displayed, and the inclination rotation mechanism 8 adjusts the rotation angle Ø and the inclination angle θ of the sample stage 5 so that the image is brought into the center (FIG. 1C).

This operation is performed by an axial adjustment portion 22 at the lower part of the panel as shown in FIG. 2, which includes check boxes 221, sliders 222, value display windows 223, and adjustment buttons 224 for the rotation and inclination, respectively. The check box 221 is checked to enable the adjustment, and the slider 222 is operated to perform rough adjustment of the rotation or inclination.

For further fine adjustment, the figure is incremented or decremented by 1 digit using the adjustment button 224. If the conditions have been already determined, the value may be directly inputted to the value display window 223. In this case, angular values (degree, radian) are easy to use. However, a digit value, that is, DAC value (input value of Digital-Analog converter) may also be used. An automatic alignment start button 21 may be provided for further simplifying the operation, which is pushed for automatic alignment.

Figure 1B:
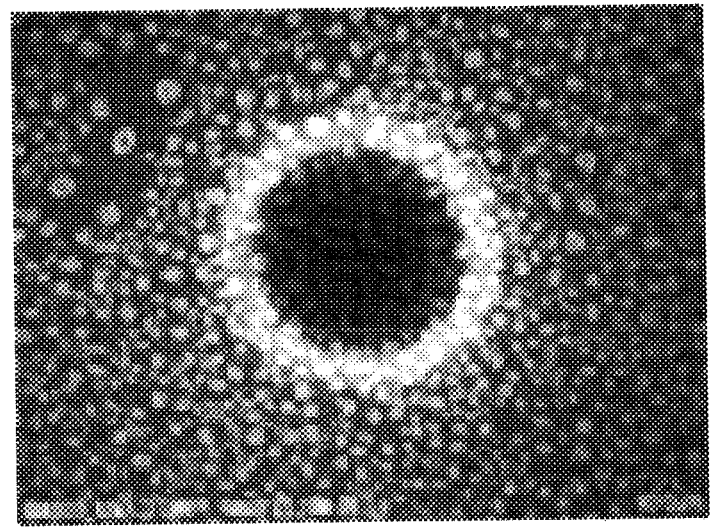
FIG. 1B shows an SEM image for the purpose of explaining visualization of the axial displacement of the retarding electric field in the electron beam apparatus according to the first embodiment.
Figure 1C:
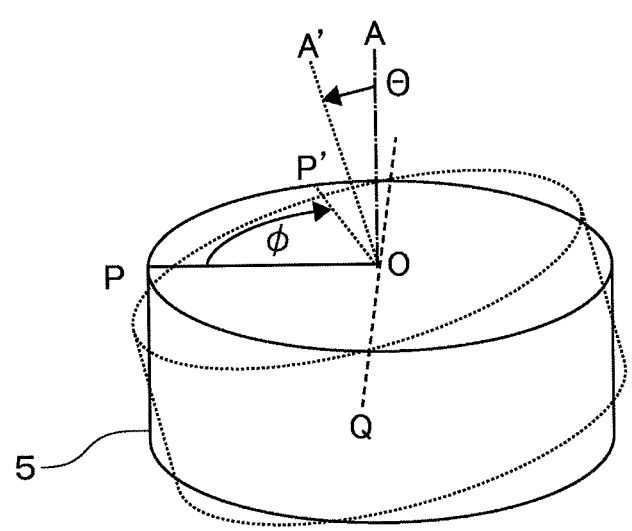
FIG. 1C is a perspective view of a sample stage for the purpose of explaining adjustment of the axial displacement of the retarding electric field in the electron beam apparatus according to the first embodiment.

When observing with increased magnification, the image having the dark region at the center as shown in FIG. 1B is obtained. However, the detector 7 hardly detects the secondary electron (SE) from the aforementioned region. As a result, the image of the backscattered electron (BSE) is obtained. This may provide the information that reflects composition of the sample indicating that the part with larger atomic number is brighter rather than the part with fine irregularity. If polycrystalline substance is employed, the crystalline information may be obtained as quantity of the backscattered electrons differs depending on the difference in the crystal orientation.

Under this condition, the axis of the electric field from the objective lens 3 to the sample is obtained. If the acceleration setting slider 25 is adjusted to change the acceleration voltage (in this case, the incident energy to the sample), the visual field displacement never occurs, or very small displacement may occur. This makes it possible to observe the same place by changing the incident energy. In this case, as the focal point and brightness of the detection electron will vary accordingly, the image obtained by differently changed incident energy may be acquired in the same visual field only by re-adjusting the focal point, contrast and brightness. The focal point is adjusted by changing the exciting current of the objective lens 3.

The insulating sample, for example, Teflon™ is likely to be charged. When such sample is observed at low acceleration, it is negatively or positively charged, resulting in difficulty in focusing. However, adjustment of inclination of the sample stage using the apparatus according to the present invention allows focusing in a short time in the same visual field even if the incident energy is changed. The incident energy condition without charging (the number of incident electrons is the same as that of the discharged electrons, that is, yield becomes 1) may be easily searched. As a result, minute observation is ensured without destroying the microstructure of Teflon™. As for the thin film laminated structure, the reaching depth varies depending on the incident energy of the electron. This may provide the advantage of discriminating the information with respect to each film of those laminated under the condition with variable incident energy.

As described above, the object to perform observation through the information discrimination and change in the incident energy of the electron beam with ease under the condition of low-acceleration and high-resolution is established by providing the means for visualizing the axial displacement of the retarding electric field and the means for adjusting the axial displacement by changing inclination of the sample stage.

Figure 3:
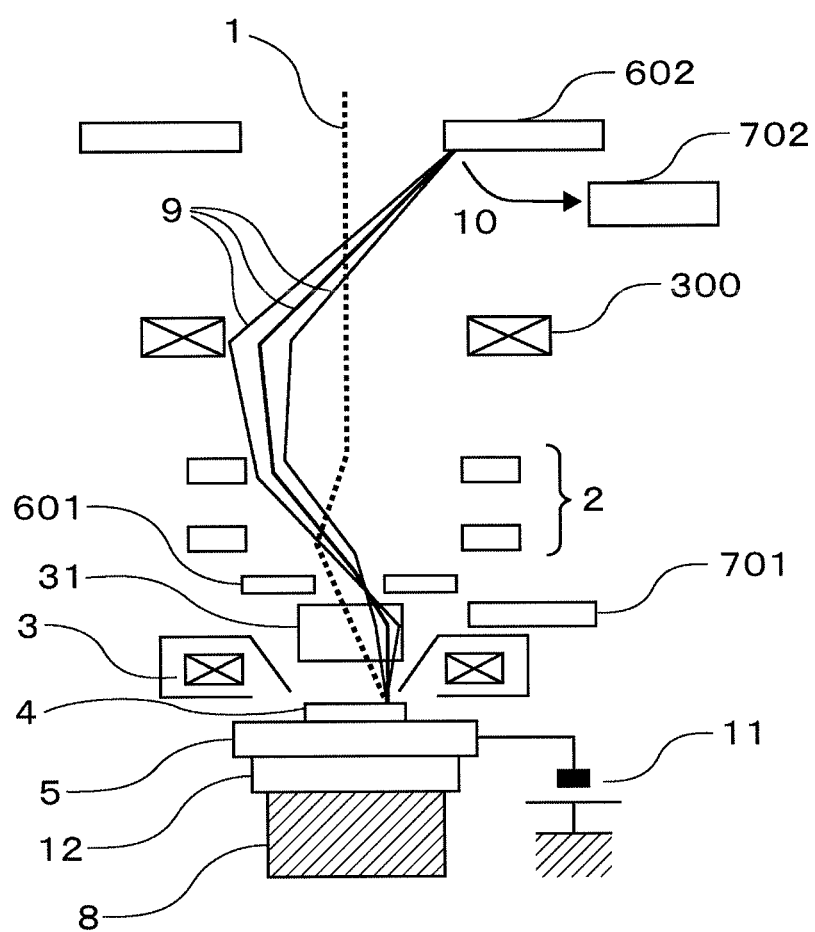
FIG. 3 is a schematic sectional view of another example structure of an essential part (inside the housing) of the electron beam apparatus according to the first embodiment.

In the embodiment, the structure shown in FIG. 1A is employed. However, any structure may be employed so long as the retarding method is used. For example, a plurality of detectors (701, 702) are provided as shown in FIG. 3. The BSE is detected by a first reflective plate 601, and the SE signal that has been passing is detected by a second reflective plate 602 located above so as to obtain the image that contains the SE information about surface irregularity in addition to the BSE information at a time. As FIG. 3 shows, a lens 300 may be provided in mid-stream of the electronic optical system. In this case, the freedom degree of the objective lens 3 is increased, thus enabling observation with high-resolution in the wider range.

The ExB 31 placed just above the objective lens 3 has the electric field E and the magnetic field B orthogonally arranged with each other, and further orthogonally arranged with respect to the axis through which the probe electron beam 1 passes. Intensity combination of the E and B is selected so as not to influence the incident probe electron beam 1. In the case where the ExB 31 is activated, the incident probe electron beam 1 is not influenced, but the electron beams generated from the sample and the low-velocity electrons generated from the first reflective plate 601 are attracted to the positive side by the electric field E. A first detector 701 placed at the aforementioned position is capable of detecting the low energy electron. Especially when applying the retarding voltage Vr, the SE passing through the center hole of the first reflective plate 601 is not detected, but only the BSE is detected efficiently. This makes it possible to provide the image with good S/N. It is to be clearly understood that the similar effects may be obtained in spite of change in not only the exemplified combination but also the change in combination of the conversion plates (reflective plates), detector, lens and ExB, and increase in the number of the respective parts so long as the axial displacement detection function and the sample stage inclining function are provided.

Figure 5:
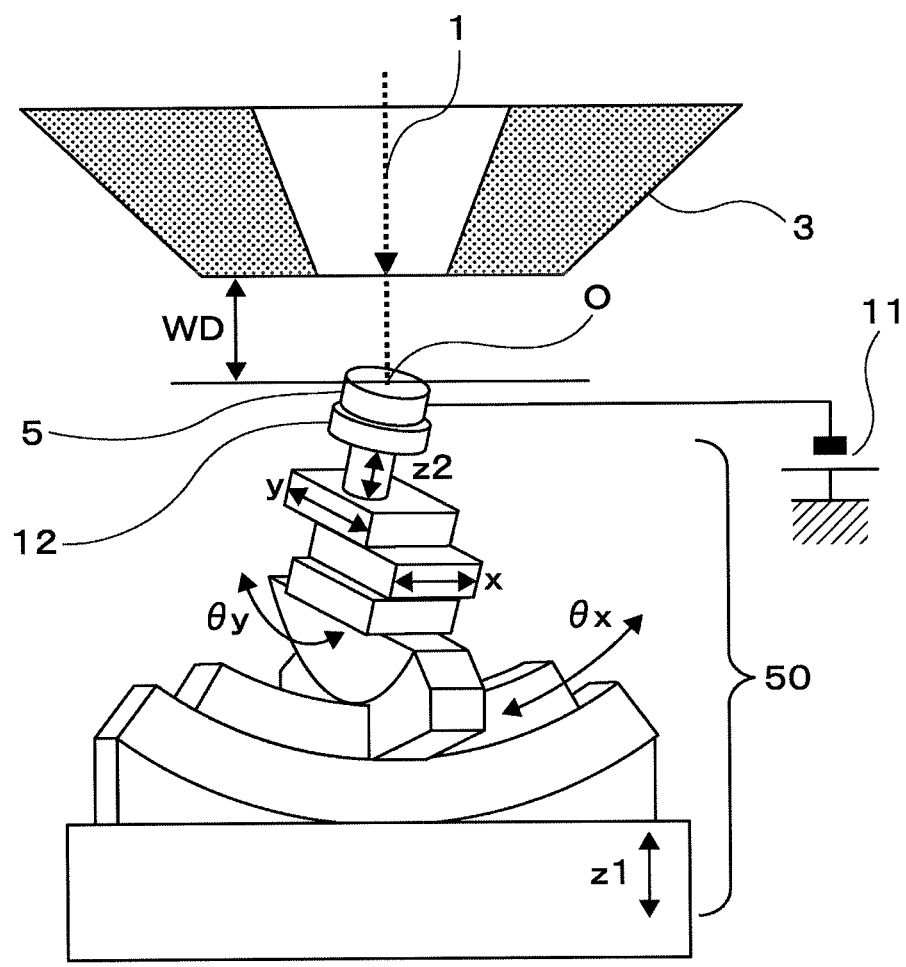
FIG. 5 is a schematic perspective view of another example structure of an essential part (sample stage mechanism portion) of the electron beam apparatus according to the first embodiment.

In this embodiment, the control mechanism of the sample stage has one axis each for rotation and inclination. However, 2-axis, that is, x-y for the inclination is also convenient as inclination may be controlled separately in the respective axes. For example, a sample stage mechanism 50 configured as schematically shown in FIG. 5 may be employed. In this case, it is structured by stacking a z1-axis stage, θx-axis stage, θy-axis stage, x-axis stage, y-axis stage, and z2-axis stage sequentially from the bottom. In this case, it is structured so that the point O that is not moved by rotations at θx and θy is positioned on the axis of the probe electron beam 1. The region of the sample on the sample stage 5, which is desired to be observed is determined by the z-axis, y-axis, and z2-axis stages, respectively. Each of θx-axis and θy-axis stages is adjusted while applying the retarding voltage and observing the axial displacement. The observation region at this time is not displaced so that the observation may be started immediately after the axial adjustment. A distance WD between the sample stage 5 and the objective lens 3, which determines the resolution and the visual field is adjusted using the z1-axis stage.

Figure 6A:
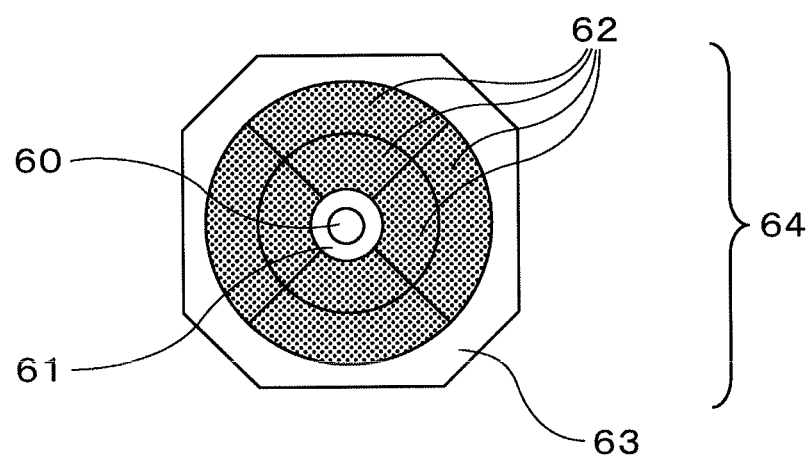
Figure 6B:
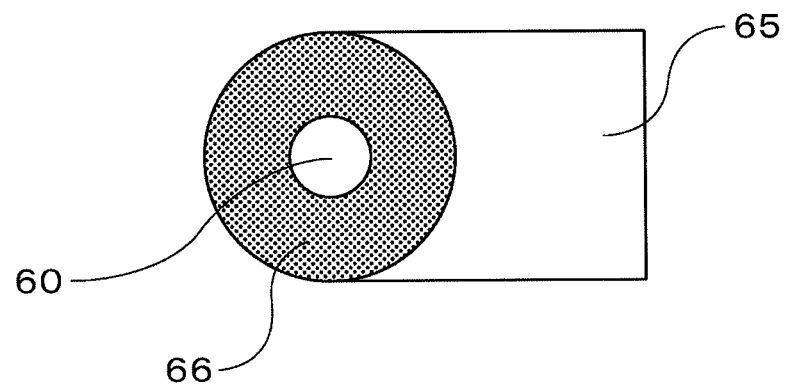

In this embodiment, the reflective plate with the center hole is used to observe the orbit of the secondary electron for the purpose of visualizing displacement of the axis of the electric field between the objective lens 3 and the sample 4. It is clear that the axial displacement may be visualized using the means other than the reflective plate. For example, use of the detector which has the hole or dead zone at the center as shown in FIGS. 6A and 6B provides the similar effects. In this case, the axial displacement of the retarding electric field is not represented by the circular ring but by the dark circle generated when the SE reaches the dead region, and the bright region as the sensitive region around the circle where the SE is irradiated.

FIG. 6A shows a semiconductor detector 64 which is primarily formed of Si. A reference 60 denotes a hole, 61 denotes a dead zone, 62 denotes a detection region, and 63 denotes a case. FIG. 6B shows a scintillator 66 with a center hole 60 (fluorescence substance which emits light upon incidence of electron beam) which is provided with a light guide 65 that guides the emitted light to the outside so that the image is formed by detecting light outside. The incident energy of electron to a certain degree is necessary to allow the fluorescence substance to be luminous. When using YAG:Ce (formed by doping cerium on yttrium, aluminum, garnet), the energy equal to 5 kV or higher is required, which may differ depending on the material for forming the fluorescence substance. The secondary electron is required to be accelerated at 5 kV or higher so as to be detected. The voltage may be given as the retarding voltage. Alternatively, application of the bias at approximately +3 kV to the YAG detector by itself may provide the same effect at the retarding voltage of 2 kV. In this case, shielding such as the shield pipe in the center hole, and metal mesh on the upper and lower sides of the detector is effective to prevent the probe electron beam 1 from being influenced. The fluorescence substance that is luminous at lower velocity, for example, P15 (ZnO) emits lights at 100 eV or lower, and accordingly, the bias is not required.

Figure 7:
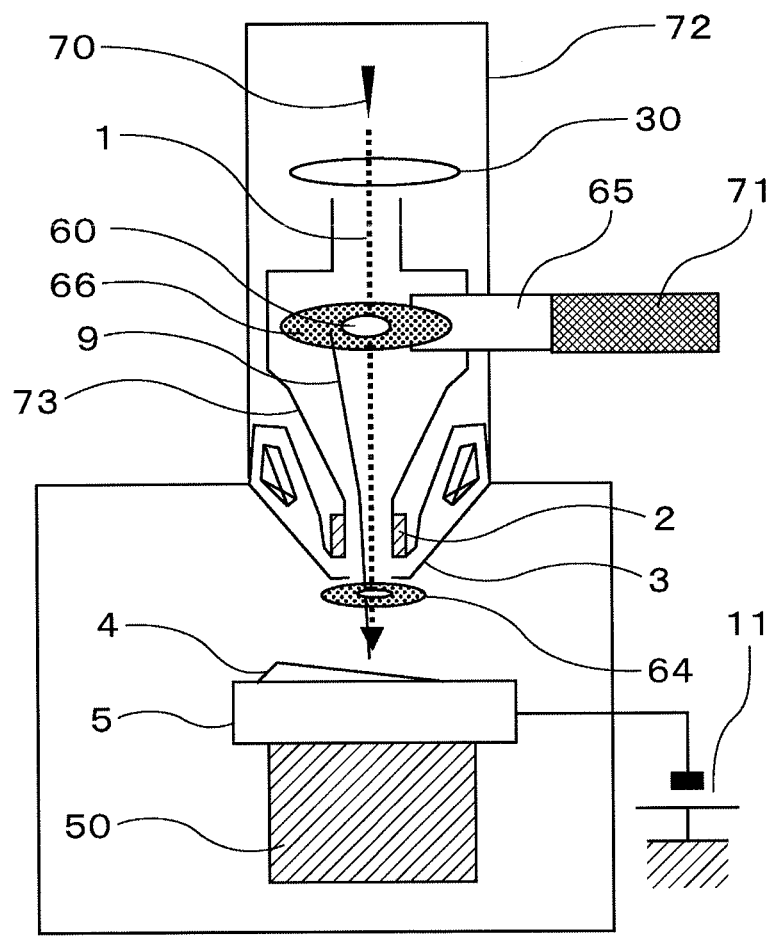
FIG. 7 is a schematic sectional view of another example structure of an essential part (housing) of the electron beam apparatus according to the first embodiment.

Those detectors which may be structured to be thin are effective for detection in the narrow place. For example, it is preferable to use the aforementioned detector for the SEM as shown in FIG. 7. The semiconductor detector 64 positioned below the objective lens 3 is configured to detect only the backscattered electron BSE, and the detector in the column is configured to detect the SE so as to obtain more information at a time. The predetermined area of the sample may be observed by changing the incident energy of the probe electron beam at the retarding voltage. This makes it possible to provide the polar surface information, inner crystalline information, composition information, fine irregularity, charging information and the like through discrimination.

Figure 4:
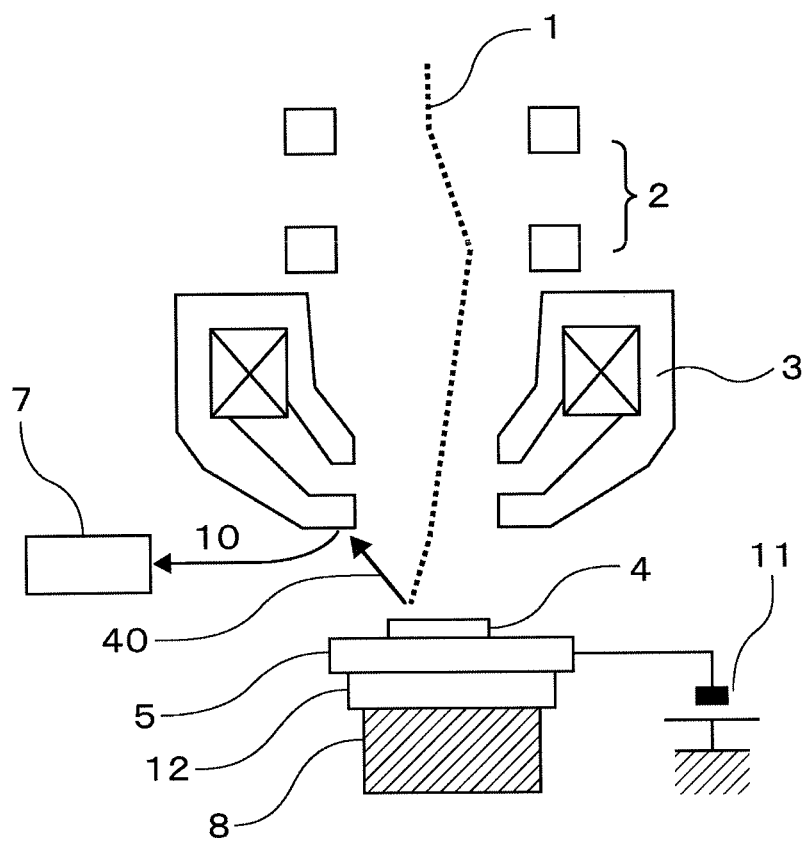
FIG. 4 is a schematic sectional view of another example structure of an essential part (inside the housing) of the electron beam apparatus according to the first embodiment.

In the region at ultra-low acceleration with the incident energy equal to or lower than 100 eV, there may be the case where the visual field displacement is increased depending on the sample configuration. In this case, it is preferable to perform the axial adjustment in accordance with the incident energy required to be used. The axial adjustment may be performed under the mirror condition where the retarding voltage is set to be equal to or slightly higher than the acceleration (setting the incident energy of the probe electron beam 1 to the sample to zero or negative value) so that quantity of the incident electrons to the sample is reduced, and most of the electrons rebounds on the electric field from the sample. In this case, the secondary electron generated by small quantity of incident electrons to the sample is measured in accordance with energy distribution of the probe electron beam 1. Alternatively, an electron beam (mirror backscattered electron beam) 40 reflected on the mirror may be converged on the back surface of the objective lens 3 as shown in FIG. 4 so that intensity of the secondary electron (detection electron) 10 generated from the objective lens 3 is measured by the detector 7. The ultra-low accelerated electron beam as described above is suitable for observation of molecules of a monolayer on the surface, layer of atoms, and measurement of a fine flaw on the insulator surface.

It is useful to apply the means for visualizing axial displacement of the retarding electric field and the means for adjusting the axial displacement by changing inclination of the sample stage 5 as described above to an out-lens type shown in FIG. 7. In this case, the scintillator 66 and the light guide 65 are used as the detector within an acceleration cylinder 73 in the column. The positive voltage selected from 3 to 8 kV is applied to the acceleration cylinder 73 and the scintillator 66 for acceleration of the probe electron beam 1. As a result, the secondary electron 9 which acquires energy of the acceleration cylinder 73 is applied to the scintillator 66, and effectively converted into light. It is further converted into the electric signal by a photo multiplier 71. The semiconductor detector 64 placed just below the objective lens mainly detects the BSE. The sample stage mechanism 50 using the retarding method includes the insulator, minute motion and inclination mechanism, which are omitted in the drawing.

The axis alignment is performed in accordance with the position of the hole 60 in the SEM image formed by the scintillator 66. Alternatively, the axis alignment may be performed at the position of the dead region of the semiconductor detector 64 at the lower position by approximating the mirror condition. This case provides advantages to reduce the aberration under the low-acceleration condition and establish the high-resolution. The incident energy may be continuously changed in accordance with variable retarding voltage, which provides the advantage that the image information is derived under the more detailed incident energy condition in a short time with ease.

As described above, according to the embodiment, provision of the means for visualizing axial displacement of the retarding electric field and the means for adjusting the axial displacement by changing inclination of the sample stage allows alleviation of the influence of the non-axial symmetry on the retarding electric field so as to provide the electron beam apparatus capable of acquiring the information through energy discrimination under the condition of low-acceleration and high-resolution. The operation panel for controlling such means is provided to easily reduce the axial displacement. The axial alignment of the retarding electric field makes it possible to suppress visual field displacement caused by change in the retarding voltage (change in the incident energy of the probe electron beam).

Second Embodiment

A second embodiment will be described referring to FIGS. 8A to 11B. Components which are described in the first embodiment, and not referred in this embodiment are applicable thereto unless otherwise specified.

Figure 8A:
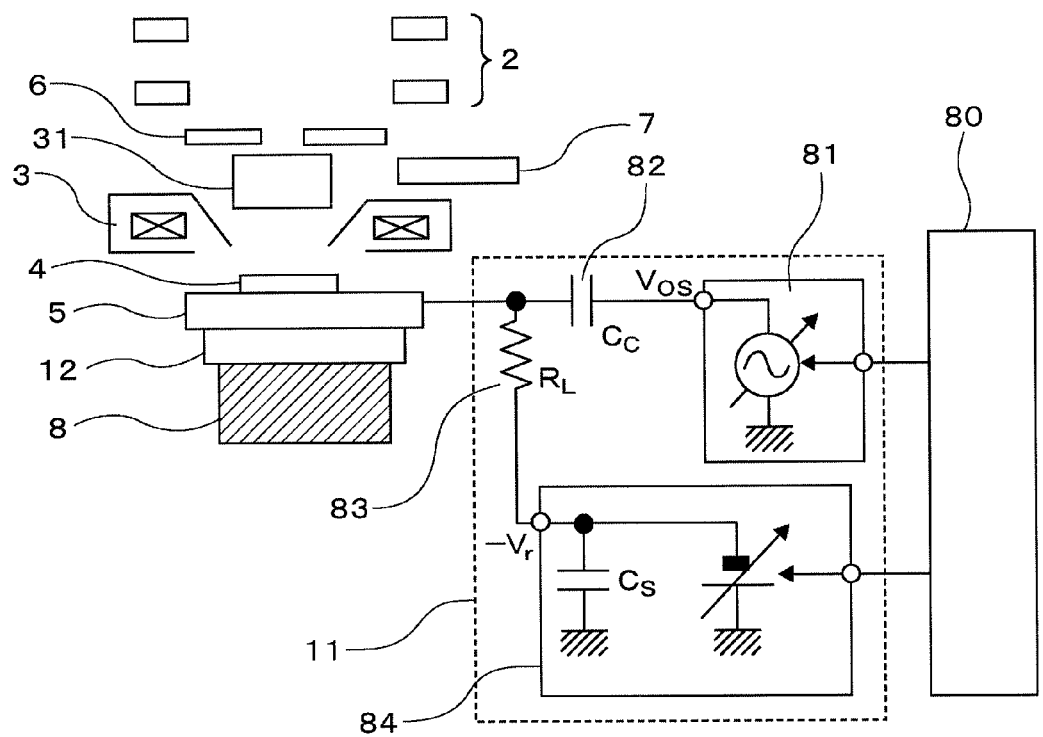
FIG. 8A is a conceptual view of an essential part of the electron beam apparatus (scanning electron microscope system) according to a second embodiment.
Figure 8B:
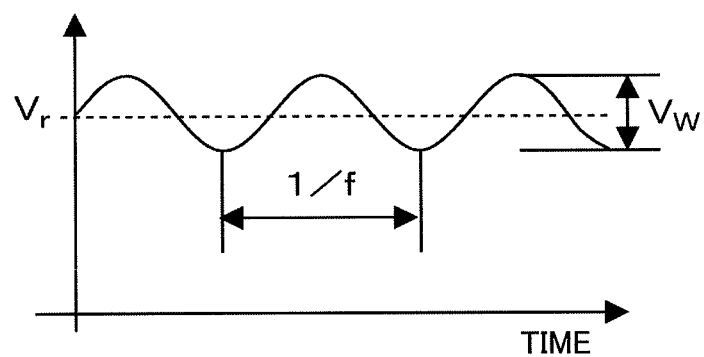
FIG. 8B is a view showing an example of a state where a wobbler signal is superposed on a retarding voltage in the electron beam apparatus according to the second embodiment.

This embodiment describes the method of observing oscillation of the image by changing the retarding voltage Vr while observing the SEM image as the means for visualizing displacement of the axial symmetry of the retarding electric field. FIG. 8A is a conceptual view of an essential part of the electron beam apparatus (scanning electron microscope system) according to the embodiment. Referring to FIG. 8A, a retarding power source 11 includes a wobbler power source 81 at frequency f in addition to a constant voltage source 84. A resistor 83 with a value of $R_L$ is inserted from the constant voltage source 84 between the wobbler power source and the sample stage 5 so that the signal from the wobbler power source 81 is transmitted to the sample stage 5 via a coupling capacitor 82 with the value Cc. As for the voltage of the sample stage, the AC signal with amplitude (wobbler signal) Vw is superposed on the retarding voltage Vr as shown in FIG. 8B. In this case, the retarding voltage Vr is 1-2 kV, and the wobbler signal Vw is approximately from 20 V to 10 V. Actual axial adjustment is performed in accordance with the flow shown in FIG. 9H.

The voltage of 1-2 kV is applied to the sample stage 5 as the retarding voltage so as to determine the region desired to be observed using the SEM with low magnification. Then the switch is turned on for starting the axial adjustment. It is started by displaying the window shown in FIG. 11A on the monitor, and clicking a wobbler button 100 to allow the SEM controller 80 shown in FIG. 8A to generate a start signal to the wobbler power source 81. The amplitude voltage of the wobbler signal may be confirmed by a wobbler voltage window 101.

Figure 9A:
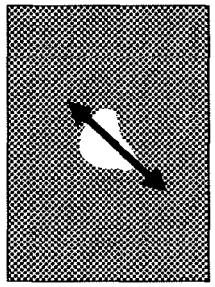
Figure 9B:
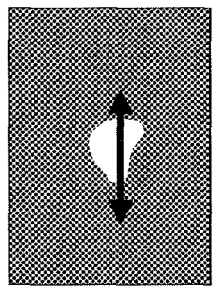
Figure 9C:
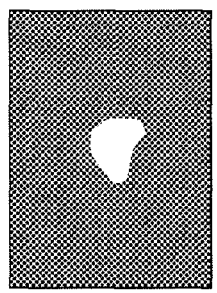
Figure 9D:
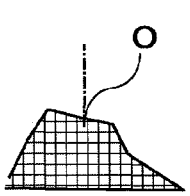

An example of the aforementioned axial adjustment method will be described referring to FIGS. 9A to 9H. The sample stage has mechanisms of unidirectional inclination θ, and a rotation Ø with respect to an axis of A-O which is defined by an observation point O on the sample stage and a line A that orthogonally intersects the observation point on the surface of the sample stage. When the wobbler gives fluctuation at the amplitude of approximately 10 V, the SEM image with magnification in the visual field of 3-6 µm oscillates in a certain direction in accordance with the axial displacement as shown in the schematic view of FIG. 9A (arrow in the drawing denotes the oscillation direction). The oscillation direction corresponds to the inclination direction of the sample surface. The rotation angle Ø of the sample stage is adjusted (FIG. 9D) so that the oscillation accords with the direction of the inclination θ, that is, the longitudinal direction shown in FIG. 9B (direction that allows the sample stage to be tiltable) in this case (FIG. 9D). The adjustment is performed by operating the axial adjustment portion 22 on the operation panel shown in FIG. 11A.

Figure 9E:
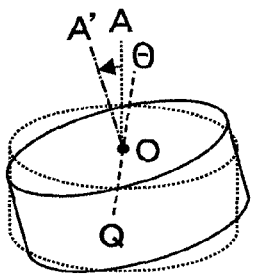
Figure 9F:
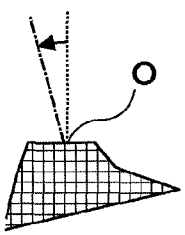
Figure 9H:
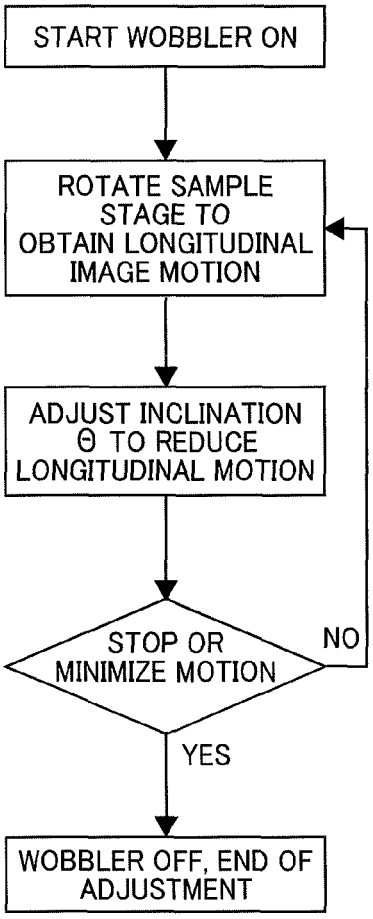
Figure 11A:
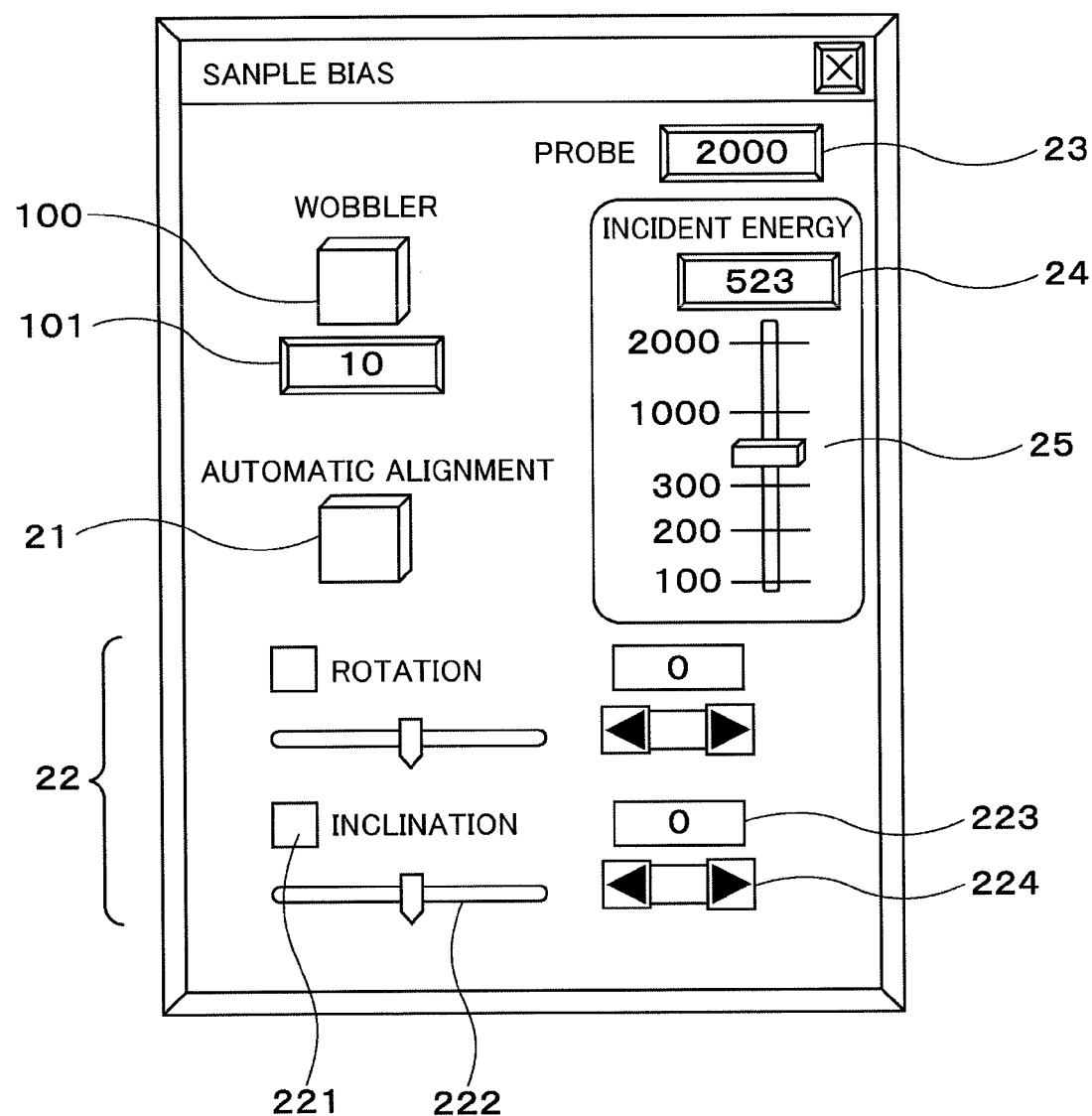
FIG. 11A shows an example of an operation panel for the means for visualizing axial displacement of the retarding electric field and the means for adjusting the axial displacement in the electron beam apparatus according to the second embodiment.
Figure 11B:
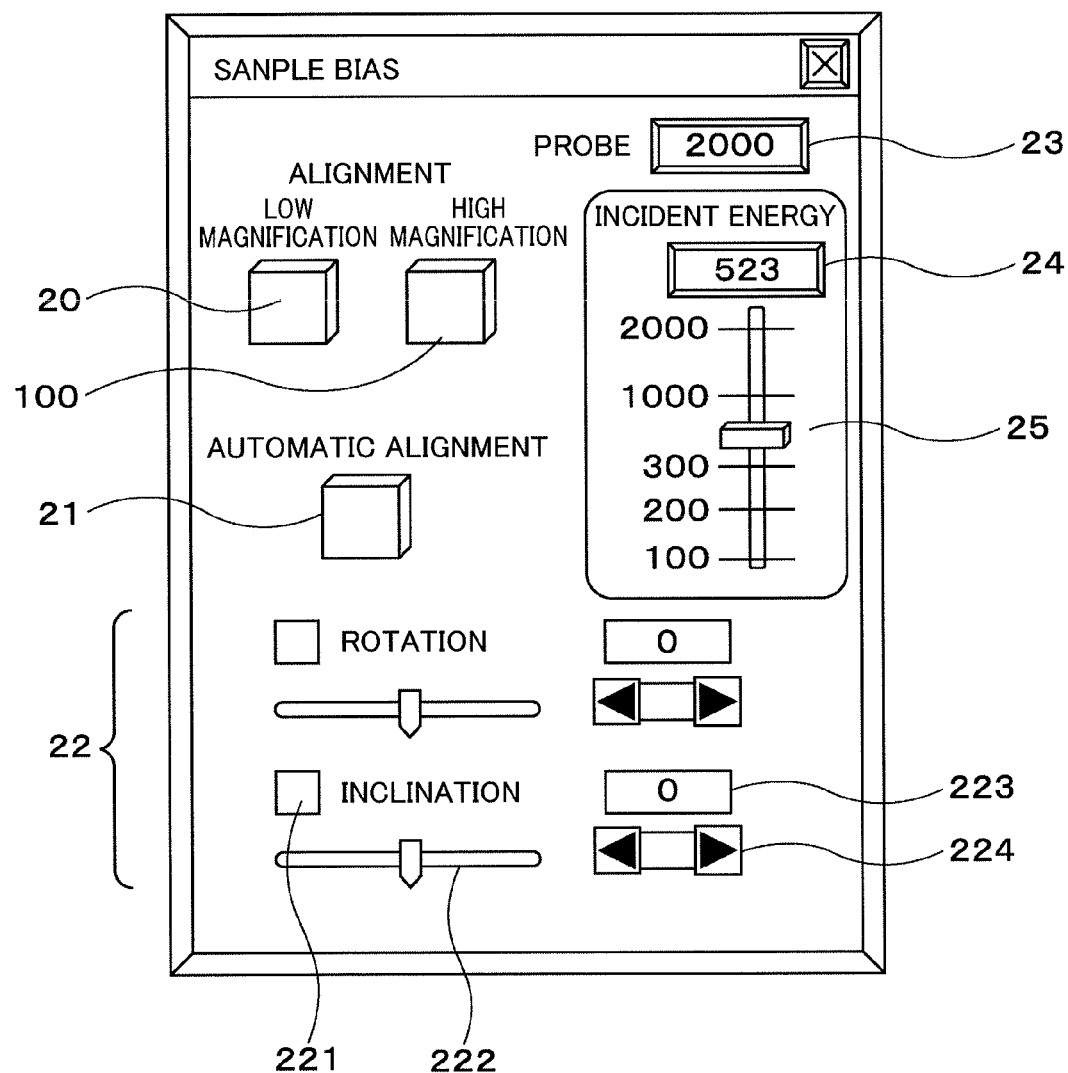
FIG. 11B shows another example of the operation panel for the means for visualizing axial displacement of the retarding electric field and the means for adjusting the axial displacement in the electron beam apparatus according to the second embodiment.

The inclination θ is adjusted so as to reduce the image oscillation in the longitudinal direction (FIG. 9E). In the case where the observation region of the sample is on the surface with inclined observation point O in the deflected electric field, the angular position is approximated nearly to be horizontal as shown in FIG. 9G so as to establish the optimal condition for the electric field. If the image motion is stopped as shown in FIG. 9C, the wobbler button 100 on the operation panel shown in FIG. 11A is operated to stop wobbling. If the image is still oscillating, the axial adjustment portion 22 on the operation panel shown in FIG. 11A is used again to adjust the rotation Ø. FIG. 9H shows a series of the process flow. Explanation with respect to adjustment of the incident energy, which is the same as that of the operation panel shown in FIG. 2 will be omitted.

It is convenient to adjust the stage so that the rotation and inclination are performed by setting the current observation position O as the center. It is also clearly convenient to control so that the observation point O is brought into the center of movements of both rotation Ø and inclination θ as the stage function. As a result, it is possible to reduce the visual field displacement to 1 µm or less when changing the incident energy to the sample with less irregularity.

Adjustment by intensifying the wobbler signal Vw (≥40 V) with higher magnification makes it possible to suppress the displacement to 0.5 µm or less. Use of the sample with large irregularity reduces the voltage range where the axis is aligned. It is favorable to perform the axis alignment again at the timing when the axial displacement is enlarged by changing the retarding voltage Vr. The same applies to the case where the incident energy range is increased to the low acceleration side. It is favorable to perform the axis alignment as needed when performing the observation at 100 V and 10 V after the observation with 2 kV.

Figure 8C:
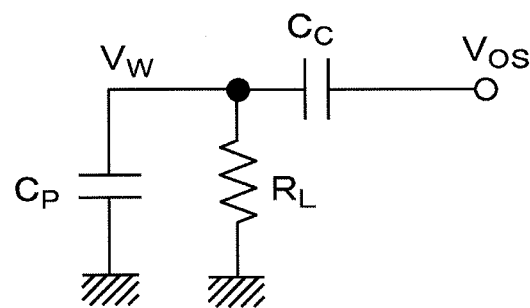
FIG. 8C represents an AC equivalent circuit from a wobbler power source to the sample stage in the electron beam apparatus according to the second embodiment.

When observing the microstructure with higher magnification, it is preferable to perform the axis adjustment again with high magnification as shown in FIG. 9. The voltage amplitude (wobbler signal) Vw through wobbling may be kept constant. However, it is further convenient to allow the user to select the amplitude. Especially, the oscillation range of the image differs depending on difference in the magnification, retarding voltage, incident energy, and status of the sample. For this, it is convenient to adjust so as to establish the appropriate oscillation range by providing the wobbler voltage window 101 as shown in FIG. 11A and inputting the figure in the window. Such voltage setting may be performed by selection from several values through operation of the dial, slider and switch. The AC equivalent circuit is influenced by the capacitance Cp of the sample stage as shown in FIG. 8C. Then the relationship between the output voltage $V_1$ of the wobbler power source module and the wobbler signal Vw will be expressed by the following formula.

[Formula 1]

$$\frac{V_W}{V_1} = \frac{1}{\sqrt{\left(\frac{1}{2\pi f C_C R_L}\right)^2 + \left(1 + \frac{C_P}{C_C}\right)^2}} \quad (1)$$

The capacitor Cc is selected in accordance with the value sufficiently larger than the Cp. In the case where the diameter of the sample stage 5 is 2 cm and the distance from the objective lens 3 is 1.5 mm, the resultant capacitance is 1.8 pF, specifically, in the order of 10 pF or lower while having the wiring capacity included. Preferably, the wobbler signal Vw is 90% or higher of the amplitude of the output voltage V1 of the wobbler power source module. The condition of $CcR_L>1.6/f$ is established based on the formula (I). The frequency f is practically about 1 Hz, and the condition of $CcR_L>1.6$ is established. The sample stage is at the high voltage of approximately 2 kV, and accordingly, pressure resistance between pole plates of the capacitor Cc needs to be at the similar voltage. As high capacity will add cost, it is selected from 10 nF to 50 pF. The corresponding value RL is selected from the one with 32 GΩ or higher from 160 M in accordance with the condition of $CcR_L>1.6$.

In the embodiment, the apparatus is employed for the SEM with the probe current of approximately 100 pA or lower. In the case where the probe current Ip is high, the potential of the sample stage is changed by the voltage drop of $R_L$Ip, and the potential is fluctuated by the change in the secondary electron and the backscattered electron, which varies the converging condition and interferes with the observation. In such a case, the lower resistance is used, and the capacity of Cc is increased so as to obtain the similar effect. For example, in the case where measurement is performed by changing acceleration at high current of Ip=100 nA, it is preferable to set the condition of $R_L$Ip<1 V. Therefore, it will be selected from RL<10 MΩ, and Cc>160 nF.

FIG. 8A illustrates the means for visualizing the axial displacement by changing the retarding voltage. The similar effect may also be obtained with another means so long as the voltage is variable. For example, outputs of the wobbler power source 81 may be added to the model that varies the output with the input voltage as the constant voltage source 84. In this case, the RL and Cc are not required. However, they are used at the frequency of 1 Hz or lower for safety of the power source. The voltage of the constant voltage source 84 is controlled by the control signal of the SEM controller. However, the similar effect may be obtained by changing the voltage with the control signal. In this case, voltages at two or more points other than the retarding voltage Vr are set within the range of the wobbler signal Vw so as to be alternately changed. Then the image motion may be identified without sequentially changing the voltage, thus providing the similar effects.

Figure 10A:
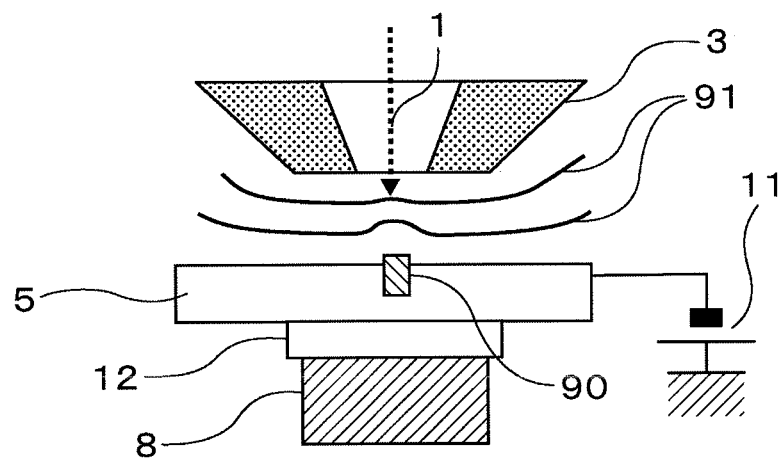

The scanning electron microscope described in the second embodiment is used for visualizing displacement of the axial symmetry of the retarding electric field, based on which the inclination of the sample stage is changed to observe a cross-section of the semiconductor substrate. FIG. 10A is a conceptual view of an area around the sample stage, which includes the equipotential lines in the retarding electric field upon observation of the semiconductor substrate (sample). Among measurements of low-acceleration and high-resolution, observation of the cross-section of the cleaved semiconductor substrate has been frequently performed. When it is observed with high resolution, something like groove is formed in the sample stage 5 so as to allow a semiconductor cross-section sample 90 to stand as shown in FIG. 10A. Although it is preferable to have a completely flat surface, the irregularity may be generated upon cleavage or fixation on the stage.

Figure 10B:
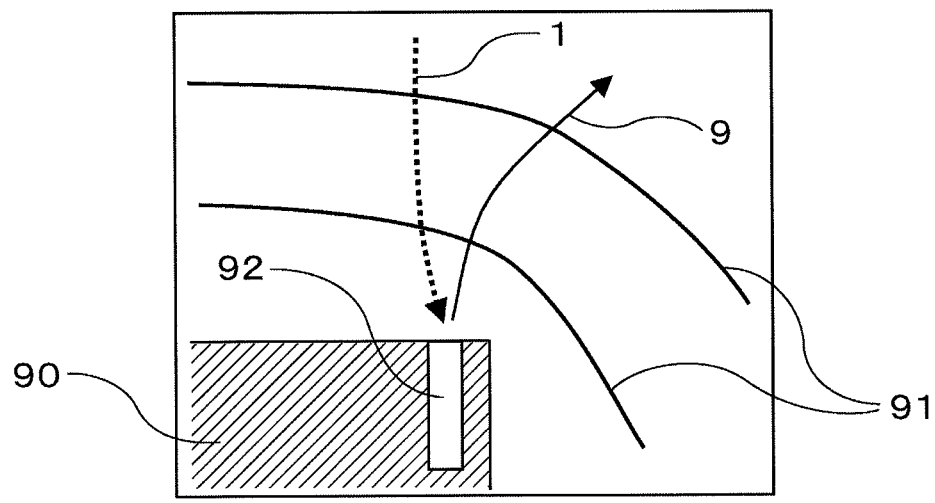

FIG. 10B is a conceptual view of an area around the sample indicating the state before axial adjustment of the retarding electric field. As FIG. 10B shows, the region desired to be observed is in the vicinity of a device region 92 at an end of the semiconductor cross-section sample 90, and the equipotential line 91 of the retarding electric field is inclined. As a result, the probe electron beam 1 is deflected, and there may cause problems that it is troublesome to search the visual field, the resolution is deteriorated owing to astigmatism and deformation, and it is difficult to observe the microstructure of the surface with the secondary electron 9 which moves away from the axis.

Figure 10C:
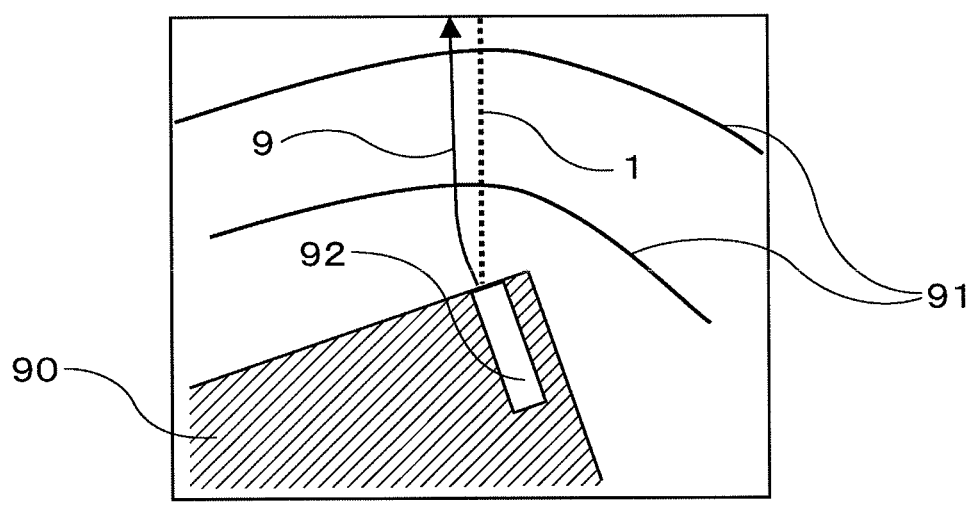

This embodiment is applied to the aforementioned structure to adjust the inclination of the semiconductor cross-section sample 90 so that the axial displacement of the retarding electric field is reduced. Then as shown in FIG. 10C, deflection of the probe electron beam 1 may be minimized to allow observation with high-resolution without causing the visual field displacement. In this case, it is difficult to have the entire electric field to have axial symmetry, but may allow optimization of the local region where the probe electron beam 1 passes toward the observed region.

As the secondary electrons which pass through the objective lens 3 along the local axis are collected by the detector, the image with high S/N ratio may be obtained. If the insulating film makes drift of the image owing to charge-up unstoppable, the retarding voltage Vr is changed so as to allow selection of the incident energy condition with minimum drift. This is because there exists the incident energy condition that equalizes quantity of electrons discharged from the sample to quantity of the incident electrons. If silicon oxide film or nitride film is formed on the surface, the condition becomes optimal at approximately 2 kV. If Si is formed on the surface, it becomes optimal at approximately 1 kV. If an organic film such as resist and polyimide is formed, it becomes optimal at 1 kV or lower. Preferably, acceleration of the probe electron 1 is set to 2 kV or higher in the range from 2.5 to 5 kV. As a result, use of the electron beam apparatus according to the embodiment provides the advantage that allows easy observation of the microstructure in a short time. Change in the incident energy varies the penetration depth of the electron, which makes it possible to discriminate the information of the device in the depth direction.

It is obviously effective to apply the electronic optical system shown in FIGS. 1, 3, 4 and 7 to the observation of the semiconductor cross-section sample. Further addition of function as described in the first embodiment to the system is effective to cover various types of sample observation. For example, if the sample with flatness such as Si and glass substrate has an obscure structure, it is effective to reflect the dead zone shape of the detector on the SEM image as described in the first embodiment.

Meanwhile, if the sample has irregularities on the surface for the cross-section observation, in most cases, the ring shape as used in the first embodiment cannot be clearly obtained with the low magnification. In this case, the method of changing the retarding voltage as described in the second embodiment is effective by aligning the local axis of the part desired to be observed. For this, it is obvious to provide the apparatus with good usability by providing the alignment start button 20 for low magnification, and the wobbler button 100 for high magnification likewise the operation panel shown in FIG. 11B.

As described above, this embodiment is provided with the means for visualizing the axial displacement of the retarding electric field, and the means for adjusting the axial displacement by changing inclination of the sample stage so as to allow alleviation of the influence of the non-axis symmetry of the retarding electric field. This makes it possible to provide the electron beam apparatus that allows information acquisition by energy discrimination under the condition of low-acceleration and high-resolution. The operation panel for controlling the aforementioned means is provided to further reduce the axial displacement with ease. Axial alignment of the retarding electric field may suppress the visual field displacement caused by the change in the retarding voltage (change in the incident energy of the probe electron beam). It is preferable to employ the wobbler power source for observation of the sample with a large number of irregularities.

The reflective plate with a hole, the scintillator, and both the detector with dead zone (first embodiment) and the wobbler power source (second embodiment) allow observation of the sample irrespective of its surface configuration whether it has flatness or a large number of irregularities.

The present invention has been described in detail, and main features of them will be described below.

(1) An electron beam apparatus is provided with at least an electron gun, an electron lens that includes an objective lens, and accelerates and converges an electron discharged from the electron gun to form the electron into a probe electron beam, a deflector that deflects the probe electron beam, a sample stage on which an observation sample is mounted, display means that displays an observed image of the observation sample, and a controller that controls the functions converges the probe electron beam on the observation sample to detect the electron generated from the observation sample for observation of a microstructure of the observation sample. The apparatus includes visualizing means provided with a retarding power source that applies an electric field for decelerating the probe electron beam between the objective lens and the observation sample, and visualizes a displacement of a retarding electric field from an axial symmetry in a region through which the probe electron beam passes between the objective lens and the observation sample upon application of a retarding voltage, and displacement reducing means that reduces the displacement of the electric field based on a result of the visualization.

(2) In the electron beam apparatus according to (1), the displacement reducing means is a mechanism that inclines the sample stage, and includes 2-axis or 1-axis inclination and 1-axis rotation.

(3) In the electron beam apparatus according to (2), the visualizing means includes first means that directly detects the electron generated from the observation sample using a detector with a circular hole or a dead zone, which is located above the observation sample, or second detection means that detects an electron generated from a plate with a circular hole, which has been generated as a result of impingement of the electron generated from the sample on the plate. The controller has a function of setting a deflection range of the probe electron beam and a lens condition of the electron lens for convergence so as to provide a circular dark region representing that the electron generated from the observation sample is in the hole or the dead zone of the first means, or the hole of the plate, and a bright region or a bright annular region representing that the detection electron is increased by irradiating a sensitive zone of the first means or a rim of the hole of the plate, and controlling the inclination mechanism of the sample stage so that the annular region is brought to a center of the image, and further has a control panel or a switch for activating the function.

(4) In the electron beam apparatus according to (1), the visualizing means has a function that changes the retarding voltage to have a desired width to visualize a visual field displacement of the observed image. The controller has a function that controls a sample stage inclination mechanism so that an oscillation of the observed image is set to zero or minimized, and includes a control panel or a switch for activating the functions.

(5) In the electron beam apparatus according to (1), the visualizing means changes the retarding voltage, and visualizes a non-symmetry of the observed image under a mirror condition in which an energy generated upon incidence of the probe electron beam to the sample is set to a value around 0 eV, and application of the probe electron beam to the sample is not allowed.

(6) In the electron beam apparatus according to at least one of (3), (4) and (5), a function that adjusts an inclination of the sample stage is provided so that the displacement from the axial symmetry is minimized.

(7) In the electron beam apparatus according to (5), means for changing the incident energy of the probe electron beam to the observation sample is allowed to select at least three points of the retarding voltage.

(8) In the electron beam apparatus according to (6), means for changing the incident energy of the probe electron beam to the observation sample is allowed to select at least three points of the retarding voltage.

(9) In the electron beam apparatus according to (8), the sample stage includes a sample stage for observing a semiconductor cross-section sample, and an acceleration of the probe electron beam is set to a value in a range from 3 kV to 5 kV upon observation of a cross-section of the sample.

(10) An electron beam apparatus is provided with an electron gun, acceleration means that accelerates an electron discharged from the electron gun so as to be formed into a probe electron beam, a sample stage on which a sample is mounted, deceleration means that decelerates the accelerated probe electron beam so as to be radiated to the sample, a controller for controlling of those components, and a display device connected to the controller. The apparatus includes visualizing means that visualizes a displacement of an electric field generated by the deceleration means from an axial symmetry, reducing means that reduces the displacement from the axial symmetry, and an operation panel that reduces the displacement from the axial symmetry by the reducing means based on an image visualized by the visualizing means.

(11) In the electron beam apparatus according to (10), the visualizing means includes a reflective plate with a hole through which the probe electron passes, image forming control means that allows formation of a focal point of a secondary electron and a backscattered electron from the sample on the reflective plate, and deflector control means that deflects the secondary electron and the backscattered electron so as to be impinged on the reflective plate with the hole.

(12) In the electron beam apparatus according to (11), the visualizing means includes a wobbler power source that superposes an alternating-current signal on the deceleration means.

(13) In the electron beam apparatus according to (11), the displacement reducing means includes an inclination rotation mechanism of the sample stage, and the operation panel includes rotation angle adjustment means that adjusts a rotation angle of the sample stage and inclination angle adjustment means that adjusts an inclination angle using the inclination rotation mechanism via the controller, and is used for reducing the displacement from the axial symmetry.

(14) In the electron beam apparatus according to (13), the operation panel further includes incident energy adjustment means that adjusts the incident energy of the probe electron beam to the sample by the deceleration means via the controller.

REFERENCE SIGNS LIST

1 . . . probe electron beam, 2 . . . deflector, 3 . . . objective lens, 4 . . . sample, 5 . . . sample stage, 6 . . . reflective plate, 6a . . . inner edge of reflective plate, 7 . . . detector, 8 . . . inclination rotation mechanism, 9 . . . secondary electron, 10 . . . detection electron, 11 . . . retarding power source, 12 . . . insulating holder, 13 . . . electron gun, 14 . . . display device, 20 . . . alignment start button, 21 . . . automatic alignment start button, 22 . . . axial adjustment portion, 221 . . . check box, 222 . . . slider, 223 . . . value display window, 224 . . . adjustment button, 23 . . . probe voltage display window, 24 . . . acceleration display window, 25 . . . acceleration setting slider, 30 . . . condenser lens, 31 . . . ExB, 40 . . . mirror backscattered electron beam, 50 . . . sample stage mechanism, 601 . . . first reflective plate, 602 . . . second reflective plate, 701 . . . first detector, 702 . . . second detector, 60 . . . hole, 61 . . . dead zone, 62 . . . detection region, 63 . . . case, 64 . . . semiconductor detector, 65 . . . light guide, 66 . . . scintillator (fluorescence substance), 70 . . . electron source, 71 . . . photo multiplier, 72 . . . vacuum vessel, 73 . . . acceleration cylinder, 80 . . . SEM controller, 81 . . . wobbler power source, 82 . . . coupling capacitor, 83 . . . resistor, 84 . . . constant voltage source, 90 . . . semiconductor cross-section sample, 91 . . . equipotential line, 92 . . . device region, 100 . . . wobbler button, 101 . . . wobbler voltage window

The invention claimed is:

1. An electron beam apparatus which is provided with at least an electron gun, an electron lens that includes an objective lens, and accelerates and converges an electron discharged from the electron gun to form the electron into a probe electron beam, a deflector that deflects the probe electron beam, a sample stage on which an observation sample is mounted, display means that displays an observed image of the observation sample, and a controller that controls the functions, and converges the probe electron beam on the observation sample to detect the electron generated from the observation sample for observation of a microstructure of the observation sample, comprising:

a visualizing means that is selected from the group consisting of a reflective plate, an optical system, and/or a detector having a hole or a dead zone at a center thereof, the visualizing means including a retarding power source that applies an electric field for decelerating the probe electron beam between the objective lens and the observation sample, and visualizes a displacement, that arises from an irregular cross-sectional shape of the observation sample surface, of a retarding electric field from an axial symmetry in a region through which the probe electron beam passes between the objective lens and the observation sample upon application of a retarding voltage, and displacement reducing means that reduces the displacement of the electric field based on a result of the visualization, wherein the displacement reducing means is a mechanism that inclines the sample stage, and includes 2-axis or 1-axis inclination and 1-axis rotation, the visualizing means includes first means that directly detects the electron generated from the observation sample using the detector, which is located above the observation sample, or second detection means that detects an electron generated from a plate with a circular hole, which has been generated as a result of impingement of the electron generated from the sample on the plate, and the controller has a function of setting a deflection range of the probe electron beam and a lens condition of the electron lens for convergence so as to provide a circular dark region representing that the electron generated from the observation sample is in the hole or the dead zone of the first means, or the hole of the plate, and a bright region or a bright annular region representing that the detection electron is increased by irradiating a sensitive zone of the first means or a rim of the hole of the plate, and controlling the inclination mechanism of the sample stage so that the annular region is brought to a center of the image, and further has a control panel or a switch for activating the function.

2. An electron beam apparatus which is provided with at least an electron gun, an electron lens that includes an objective lens, and accelerates and converges an electron discharged from the electron gun to form the electron into a probe electron beam, a deflector that deflects the probe electron beam, a sample stage on which an observation sample is mounted, display means that displays an observed image of the observation sample, and a controller that controls the functions, and converges the probe electron beam on the observation sample to detect the electron generated from the observation sample for observation of a microstructure of the observation sample, comprising:
- a visualizing means that is selected from the group consisting of a reflective plate, an optical system, and/or a detector having a hole or a dead zone at a center thereof, the visualizing means including a retarding power source that applies an electric field for decelerating the probe electron beam between the objective lens and the observation sample, and visualizes a displacement, that arises from an irregular cross-sectional shape of the observation sample surface of a retarding electric field from an axial symmetry in a region through which the probe electron beam passes between the objective lens and the observation sample upon application of a retarding voltage, and
- displacement reducing means that reduces the displacement of the electric field based on a result of the visualization, wherein
  - the visualizing means has a function that changes the retarding voltage to have a desired period to visualize a visual field displacement of the observed image; and
  - the controller has a function that controls a sample stage inclination mechanism so that an oscillation of the observed image is set to zero or minimized, and includes a control panel or a switch for activating the functions.

3. The electron beam apparatus according to claim 1, wherein the visualizing means changes the retarding voltage, and visualizes the displacement of the electric field as a non-symmetry of the observed image under a mirror condition in which an energy generated upon incidence of the probe electron beam to the sample is set to a value around 0 eV, and application of the probe electron beam to the sample is not allowed.

4. The electron beam apparatus according to claim 1, wherein a function that automatically adjusts an inclination of the sample stage is provided so that the displacement from the axial symmetry is minimized.

5. The electron beam apparatus according to claim 2, wherein a function that automatically adjusts an inclination of the sample stage is provided so that the displacement from the axial symmetry is minimized.

6. The electron beam apparatus according to claim 3, wherein a function that adjusts an inclination of the sample stage is provided so that the displacement from the axial symmetry is minimized.

7. The electron beam apparatus according to claim 4, wherein the visualizing means further includes a function that changes the retarding voltage to have a desired period and visualizes the visual field displacement of the observed image.

8. The electron beam apparatus according to claim 4, wherein the visualizing means further changes the retarding voltage, and visualizes the displacement of the electric field as a non-symmetry of the observed image under a mirror condition in which an energy generated upon incidence of the probe electron beam to the sample is set to a value around 0 eV, and application of the probe electron beam to the sample is not allowed.

9. The electron beam apparatus according to claim 5, wherein the visualizing means further changes the retarding voltage, and visualizes the displacement of the electric field as a non-symmetry of the observed image under a mirror condition in which an energy generated upon incidence of the probe electron beam to the sample is set to a value around 0 eV, and application of the probe electron beam to the sample is not allowed.

10. The electron beam apparatus according to claim 7, wherein the visualizing means further changes the retarding voltage, and visualizes the displacement of the electric field as a non-symmetry of the observed image under a mirror condition in which an energy generated upon incidence of the probe electron beam to the sample is set to a value around 0 eV, and application of the probe electron beam to the sample is not allowed.

11. The electron beam apparatus according to claim 3, wherein means for changing an incident energy of the probe electron beam to the observation sample is allowed to select at least three points of the retarding voltage.

12. The electron beam apparatus according to claim 4, wherein means for changing the incident energy of the probe electron beam to the observation sample is allowed to select at least three points of the retarding voltage.

13. The electron beam apparatus according to claim 12, wherein the sample stage includes a sample stage for observing a semiconductor cross-section sample, and an acceleration of the probe electron beam is set to a value in a range from 3 kV to 5 kV upon observation of a cross-section of the sample.

14. An electron beam apparatus which includes an electron gun, acceleration means that accelerates an electron discharged from the electron gun so as to be formed into a probe electron beam, a sample stage on which a sample is mounted, deceleration means that decelerates the accelerated probe electron beam so as to be radiated to the sample, a controller for controlling of them, and a display device connected to the controller, comprising:
- a visualizing means that is selected from the group consisting of a reflective plate, an optical system, and/or a detector having a hole or a dead zone at a center thereof, the visualizing means visualizing a displacement, that arises from an irregular cross-sectional shape of the observation sample surface, of an electric field generated by the deceleration means from an axial symmetry,
- reducing means that reduces the displacement from the axial symmetry, and
- an operation panel that reduces the displacement from the axial symmetry by the reducing means based on an image visualized by the visualizing means, wherein
  - the reflective plate has a hole through which the probe electron passes, and
  - the visualizing means includes image forming control means that allows formation of a focal point of a secondary electron and a backscattered electron from the sample on the reflective plate, and deflector control means that deflects the secondary electron and the backscattered electron so as to be impinged on the reflective plate with the hole.

15. An electron beam apparatus which includes an electron gun, acceleration means that accelerates an electron discharged from the electron gun so as to be formed into a probe electron beam, a sample stage on which a sample is mounted, deceleration means that decelerates the accelerated probe electron beam so as to be radiated to the sample, a controller for controlling of them, and a display device connected to the controller, comprising:

a visualizing means that is selected from the group consisting of a reflective plate, an optical system, and/or a detector having a hole or a dead zone at a center thereof, the visualizing means visualizing a displacement, that arises from an irregular cross-sectional shape of the observation sample surface, of an electric field generated by the deceleration means from an axial symmetry, reducing means that reduces the displacement from the axial symmetry, and an operation panel that reduces the displacement from the axial symmetry by the reducing means based on an image visualized by the visualizing means, wherein the visualizing means includes a wobbler power source that superposes an alternating-current signal on the deceleration means.

16. The electron beam apparatus according to claim 14, wherein:

the displacement reducing means includes an inclination rotation mechanism of the sample stage; and the operation panel includes rotation angle adjustment means that adjusts a rotation angle of the sample stage and inclination angle adjustment means that adjusts an inclination angle using the inclination rotation mechanism via the controller, and is used for reducing the displacement from the axial symmetry.

17. The electron beam apparatus according to claim 16, wherein the operation panel further includes incident energy adjustment means that adjusts the incident energy of the probe electron beam to the sample by the deceleration means via the controller.

* * * * *